US005751413A

United States Patent [19]
Chung et al.

[11] Patent Number: 5,751,413
[45] Date of Patent: May 12, 1998

[54] BEAT FREQUENCY STABILIZING APPARATUS OF PULSE LIGHT AND PROBE LIGHT FOR MEASURING STRAIN DISTRIBUTION OF OPTICAL FIBER

[75] Inventors: Min Ho Chung; Tomohiro Murakami; Suk Young Song; Ki Yeul Kim; Ho Bum Lee; Jin Ki Cho; Young Ki Cho, all of Taejeon, Rep. of Korea

[73] Assignee: Korea Telecommunication Authority, Seoul, Rep. of Korea

[21] Appl. No.: 728,441

[22] Filed: Oct. 10, 1996

[30] Foreign Application Priority Data

Oct. 10, 1995 [KR] Rep. of Korea ............... 95-34675

[51] Int. Cl.$^6$ ............................................ G01B 11/16
[52] U.S. Cl. ................................... 356/73.1; 372/32
[58] Field of Search .......................... 356/73.1; 372/32

[56] References Cited

U.S. PATENT DOCUMENTS 4,856,011   8/1989   Shimada et al. ................. 372/38
5,440,207   8/1995   Otsuka ............................ 315/149

FOREIGN PATENT DOCUMENTS 2276508   9/1994   United Kingdom ............ 356/73.1

*Primary Examiner*—Vincent P. McGraw
*Attorney, Agent, or Firm*—Merchant Gould Smith Edell Welter Schmidt

[57] ABSTRACT

An apparatus for stabilizing the light output frequency of each laser diode for pulse light and probe light for measuring the distribution of strain, by controlling the change of the light output frequency of the laser diode due to external causes by input current of the laser diode. The apparatus is constructed such that the frequency variation of the laser diodes is detected to then generate a signal corresponding to the variation. Then, the signal is fed back to a temperature-current controller to be used as the input current signal of the laser diode.

7 Claims, 3 Drawing Sheets

5,751,413

BEAT FREQUENCY STABILIZING APPARATUS OF PULSE LIGHT AND PROBE LIGHT FOR MEASURING STRAIN DISTRIBUTION OF OPTICAL FIBER

BACKGROUND OF THE INVENTION

1. Field of the Invention

The present invention relates to an apparatus for measuring strain for an optical fiber, and more particularly, to a beat frequency stabilizing apparatus of pulse light and probe light for measuring strain distribution of an optical fiber by stabilizing the beat frequency of pulse light and probe light applied to an optical fiber.

2. Description of the Prior Art

In general, information transmitting methods are largely classified into wireless communication methods and wired communication methods. In wireless communication methods information is transmitted by sending out a radio wave into free space, and in wire communication methods information is transmitted by sending an electrical signal along a metal line such as copper line. In contrast, in optical communication methods information is transmitted by waveguiding light to an optical fiber. The optical communication method is similar to the conventional wire communication method in that it uses a line, i.e., an optical fiber line, but is quite different from the wire communication method, in that the information is transmitted by using light, instead of using electricity as in the conventional wire communication method. Also, using the optical fiber as an information transmitting material in the optical communication method is quite different from the wireless communication method that uses the "ether". An optical fiber composed of a centrally positioned core and a cladding encompassing the core. The core and cladding are made of glass or plastic having excellent insulating properties. The refractive index of the core is larger than that of the cladding. Thus, the light which propagates along the core of the optical fiber undergoes total reflection at the boundary of the core and cladding while traveling forward, thereby transmitting predetermined information.

As is well know, optical fibers are used as the information transmitting material to obtain the following advantages;

1. The optical fiber is small in volume and light. Thus, the optical fiber can be adopted easily anywhere.
2. Since the frequency bandwidth of the optical fiber is large, many signals may be transmitted simultaneously.
3. Since the optical fiber is made of nonconductive insulating material, it is not influenced by external electromagnetic waves. Thus, the signal may be transmitted without noise.
4. Due to the development of optical fiber technology, optical fibers can be manufactured at a low cost.

Owing to the aforementioned advantages, the optical fiber is widely used as an exclusive line for data communication and as an optical modem.

Generally, the frequency performance of an optical fiber is checked before commercializing the optical fiber. In order to check the frequency performance of optical fiber, the optical fiber is extended lengthwise to apply strain thereto. At this time, in order to measure the distribution of the strain applied to the optical fiber, a pulse light and a probe light are radiated to both ends of the optical fiber. The pulse light applied to one end of the optical fiber is converted into a scattered light in the optical fiber depending on the extent of the strain applied to the optical fiber. The scattered light has a frequency different from the original frequency of the pulse light, i.e., is frequency shifted by the Brillouin frequency. Generally, the relationship of the change in the frequency-to-strain of the optical fiber can be obtained by measuring the scattered light whose frequency is changed by the Brillouin frequency. In other words, if the pulse light is radiated from one end of the optical fiber, the back-scattered light whose frequency is shifted by an original Brillouin frequency shift of the optical fiber by the pulse light travels in a direction opposite that of the pulse light. Therefore, the back-scattered light travels in the same direction as that of the probe light, and thus the scattered light is added to the probe light. In order to optically amplify the back-scattered light by its interaction with the probe light, the light frequency of the probe light should correspond to that of the back-scattered light. For this purpose, the frequency of the probe light is tuned. If the tuned frequency of the probe light corresponds to that of the scattered light, optical amplification occurs, thereby measuring the distribution of strain of the optical fiber.

The shift of the light frequency of the back-scattered light by the pulse light is dependent on the original Brillouin frequency shift and the magnitude of the strain applied to the optical fiber, and is higher than the light frequency of the pulse light at all times. Therefore, if the light frequency of the probe light is made higher than that of the pulse light by the Brillouin frequency shift, the back-scattered light and probe light interact with each other to undergo optical amplification in a strain-free state.

In order to measure the magnitude of the strain applied to the optical fiber, it is necessary to control the beat frequency (difference frequency) of the pulse light and probe light exactly. To this end, it is necessary to constantly maintain the frequency difference output from a laser diode for generating the pulse light and probe light.

Conventionally, an independent temperature-current controller is used to control the frequency output from the laser diode. However, the output frequency of the laser diode for measuring the distribution of the strain of the optical fiber is greatly influenced by the current applied to the diode and ambient temperature. Therefore, it is difficult to consistently maintain the stability of the beat frequency to be less than or equal to several MHZ for exactly measuring the strain of the optical fiber.

SUMMARY OF THE INVENTION

An object of the present invention is to accurately measure the distribution of strain applied to an optical fiber.

Another object of the present invention is to provide a beat frequency stabilizing apparatus of pulse light and probe light for measuring the distribution of strain for an optical fiber for stabilizing an output frequency of a laser diode for generating the pulse light and probe light incident onto the optical fiber.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENTS

Figure 1:
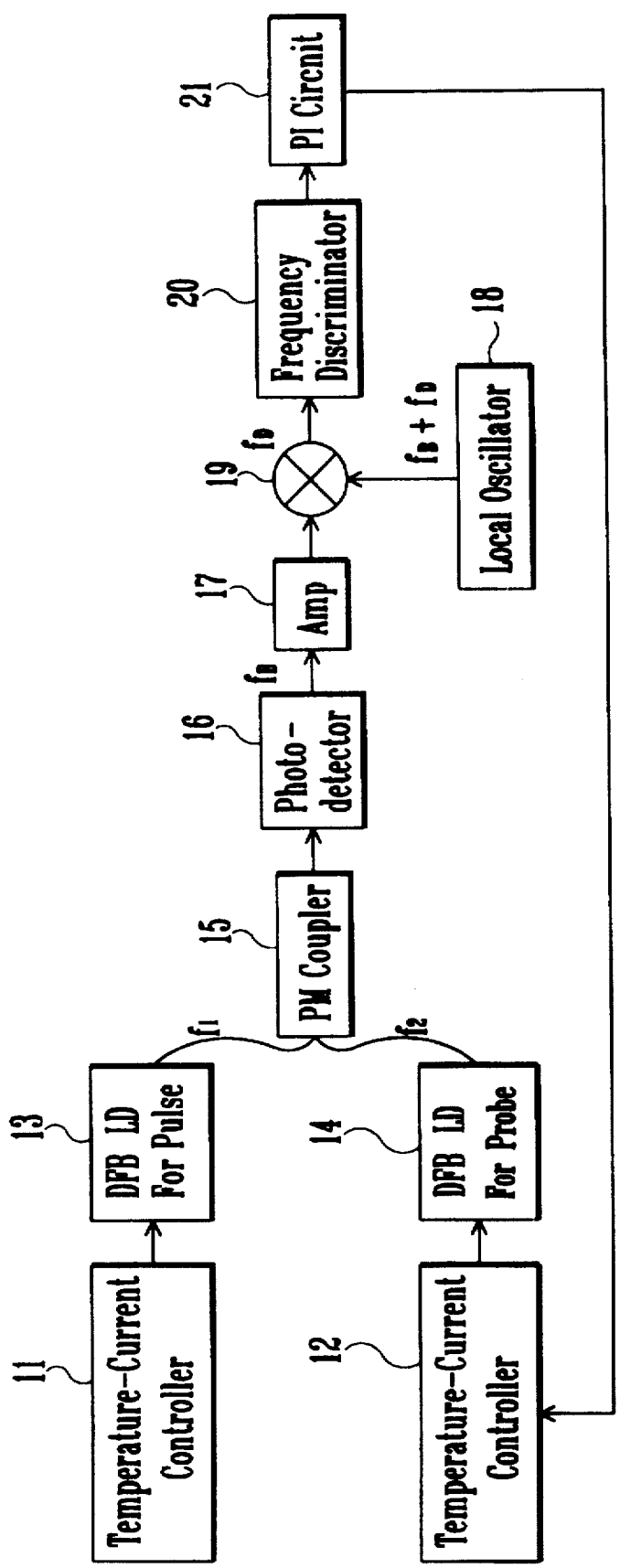
FIG. 1 is a schematic diagram of a beat frequency stabilizing apparatus according to the present invention.

A beat frequency stabilizing apparatus of pulse light and probe light for measuring the distribution of strain for an optical fiber, according to the present invention, includes a laser diode for outputting a predetermined frequency for measuring the distribution of strain of the optical fiber, a temperature-current controller for controlling the driving current and temperature of the laser diode, a polarization maintaining (PM) coupler 15 for receiving the output of the laser diode and generating a mixed light signal, a photodetector 16 for converting the mixed light signal output from the PM coupler 15 into an electrical signal, an amplifier 17 for amplifying the electrical signal of the photodetector 16, a local oscillator 18 for generating a signal having a predetermined oscillating frequency, a mixer 19 for mixing an amplification signal of the amplifier 17 and an oscillation signal of the local oscillator 18 and generating a signal having a difference frequency between the amplification signal and oscillation signal, a frequency discriminator 20 for comparing an output signal of the mixer 19 with a central frequency and controlling an output voltage according to the comparison result, a proportional integrator (PI) 21 for integrating the output voltage of the frequency discriminator 20 and negatively feeding back a proportional current to the temperature-current controller 11 and 12.

The laser diode includes a first distributed feedback laser diode (DFB LD) 13 for generating pulse light having a first central frequency $f_1$, and a second distributed feedback laser diode 14 for probe light for generating probe light having a second central frequency $f_2$.

The temperature-current controller includes a first temperature-current controller 11 for controlling the driving current and temperature of the first distributed feedback laser diode 13 for pulse light and a second temperature-current controller 12 for controlling the driving current and temperature of the second distributed feedback laser diode 14 for probe light.

The PM coupler 15 generates a difference light signal having a frequency given by the difference between the pulse light and probe light frequencies.

The output signal of the proportional integrator 21 is negatively fed back to the second temperature-current controller 12.

The second central frequency is higher than the first central frequency by a Brillouin frequency shift.

Also, the oscillating frequency of the local oscillator 18 is higher than the output frequency of the photodetector 16 passing the amplifier 17 by about 1 GHz.

The operation of the present invention having the aforementioned configuration will now be described.

First, in order to obtain the output light from the first and second DFB LDS 13 and 14 for pulse light and probe light, the driving current and temperature are set by the first and second temperature-current controllers 11 and 12. At this time, the temperature and current are set such that the light frequency of the first DFB LD 13 for pulse light is higher than that of the second DFB LD 14 for probe light by an amount equal to the Brillouin frequency shift of the optical fiber, for example, $f_B$=10.915 GHz.

Figure 2A:
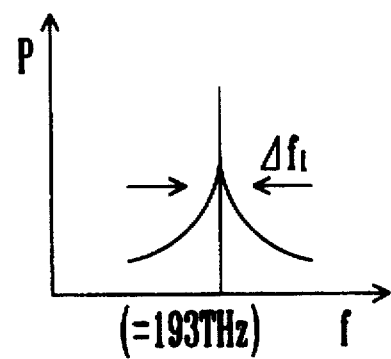
FIG. 2A is a frequency characteristic diagram of a distributed feedback laser diode for pulse light shown in FIG. 1.

At this time, the characteristics of the light frequency output from the first DFB LD 13 for pulse light are such that the central frequency $f_1$ is 193 THz and the line width is $\Delta f_1$, as shown in FIG. 2A.

Figure 2B:
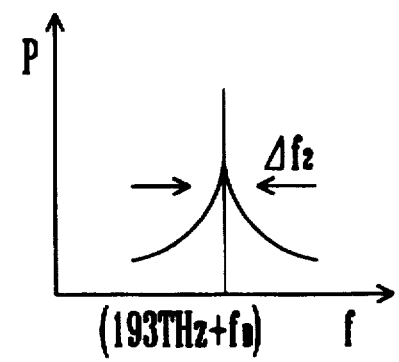
FIG. 2B is a frequency characteristic diagram of a distributed feedback laser diode for probe light shown in FIG. 1.

The characteristics of the light frequency out from the second DFB LD 14 for probe light are such that the central frequency $f_2$ is $f_1+f_B$ and the line width is $\Delta f_2$, as shown in FIG. 2B.

The thus-obtained two light signals are coupled by the PM coupler 15.

The coupled signal of the PM coupler 15 is then converted into an electrical signal by the photodetector 16.

Figure 2C:
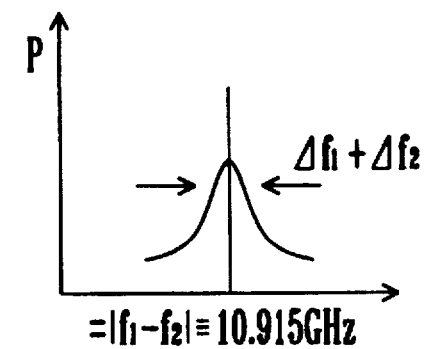
FIG. 2C is a frequency characteristic diagram of a photodetector shown in FIG. 1.
Figure 2D:
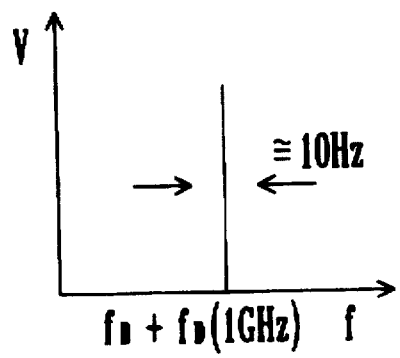
FIG. 2D is a frequency characteristic diagram of a local oscillator shown in FIG. 1.

In other words, the frequency of the signal obtained from the photodetector 16 is a beat frequency of the first and second DFB LDS 13 and 14 and the waveform of the output frequency is characterized by the central frequency $f_B$, which is 10.915 GHz in the present example, and the line width is $\Delta f_1+\Delta f_2$, as shown in FIG. 2C.

As described above, since two kinds of light are converted into a signal having a different frequency therebetween in the course of coupling by the PM coupler 15, the beat frequency is obtained.

Finally, the signal output from the first DFB LD 13 for pulse light is primarily converted from a higher light frequency of 193 THz into a lower light frequency of 10.915 GHz. However, the frequency of this signal is still high enough so as to be electrically processed and require conversion into a lower frequency.

Figure 2E:
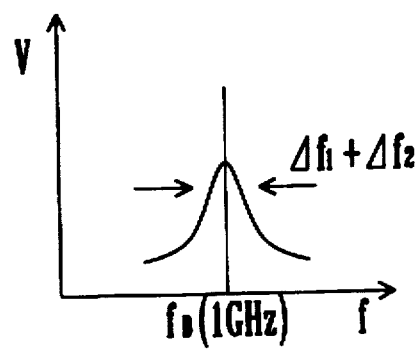
FIG. 2E is a frequency characteristic diagram of a mixer shown in FIG. 1.
Figure 2F:
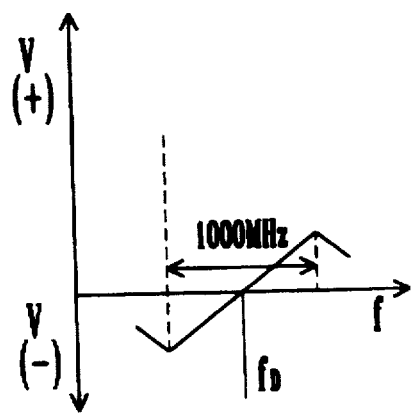
FIG. 2F is a frequency characteristic diagram of a frequency discriminator shown in FIG. 1.

The signal of the amplifier 17 is mixed with the signal oscillating signal generated at the local oscillator 18 in the mixer 19 to thus obtain the difference signal as a central frequency $f_D$. The frequency output from the local oscillator 18 is higher than the central frequency of the photodetector 16 by about $f_B$, as shown in FIG. 2E.

Therefore, a frequency of 10.915 GHz can be converted into a lower frequency of around 1 GHz.

Thereafter, the output signal of the mixer 19, whose central frequency $f_D$ is around 1 GHz, is applied to the frequency discriminator 20.

The frequency discriminator 20 operates as follows. Based on the original central frequency of the frequency discriminator 20, an output voltage of zero volts are produced when an input frequency is identical therewith, a negative voltage proportional to the difference frequency, is produced when the central frequency of the input signal is lower than the original frequency. Likewise, a positive voltage, proportional to the difference frequency, is produced when the central frequency of the input signal is higher than the original frequency.

Therefore, based on the original central frequency of the frequency discriminator 20, if the frequency-varying input signal is applied to the frequency discriminator 20, the voltage proportional to the frequency variation is output from the frequency discriminator 20. The output signal of the frequency discriminator 20 is applied to the proportional integrator 21 and the variation is negatively fed back to the first temperature-current controller 11 by a proportional integration formula. Therefore, the input current of the second DFB LD 14 for probe light is controlled, thereby stabilizing the light output frequency of the DFB LD 14 for probe light.

The frequency of the laser diode output changes depending on the change of the input current. Thus, a stable light output frequency can always be obtained by controlling the input current of the laser diode.

In a case where the initially set light output frequency of the laser diode is changed by ambient conditions, that is, if a beat frequency deviates from a set value, the method of stabilizing a light output frequency of the laser diode by maintaining the set value by correcting the error, will now be described.

First, for example, the temperature and current of the first and second DFB LDS 13 and 14 for pulse light and probe light are set by the temperature-current controllers 11 and 12, and the light output frequency difference of the first and second DFB LDs 13 and 14, i.e., the beat frequency output from the photodetector 16, is set to 10.915 GHz. However, if the light output frequency deviates by about 10 MHz due to some external cause, the central frequency of the beat frequency coupled in the PM coupler 15 and output from the photodetector 16 then becomes 10.925 GHz.

Therefore, the output signal of the photodetector 16 (10.925 GHz) and that of the local oscillator 18 (11.915 GHz) are mixed in the mixer 19. Thus, a frequency output signal of 1.010 GHz corresponding to the difference between two input frequencies is obtained.

The variation in output signal frequency from the frequency discriminator 20 is fed back to the second temperature-current controller 12 via the proportional integrator 21. If a positive output voltage is fed back, the second temperature-current controller 12 lowers the current and temperature. Therefore, the light output frequency of the DFB LD 14 for probe light becomes lower, which stabilizes the initially set beat frequency.

As described above, according to the present invention, the beat frequency stabilizing apparatus for pulse light and probe light for measuring the distribution of strain for an optical fiber can always obtain a stable output frequency by controlling the input current of two laser diodes for generating the pulse light and probe light. Therefore, the distribution of the strain applied to the optical fiber can be measured easily. Also, according to the present invention, the change in bit frequencies is continuously monitored and corrected, thereby allowing a very stable light output frequency of laser diodes to be obtained.

What is claimed is:

1. A beat frequency stabilizing apparatus of pulse light and probe light for measuring the distribution of strain for an optical fiber, comprising:

a laser source for outputting predetermined optical frequencies;

a temperature-current controller for controlling driving current and temperature in said laser source;

a polarization maintaining (PM) coupler for receiving the optical frequencies output by said laser source to produce a mixed light signal;

a photodetector for converting said mixed light signal output from said PM coupler into an electrical signal;

an amplifier for amplifying said electrical signal of said photodetector;

a local oscillator for generating an oscillating signal having a predetermined frequency;

a mixer for mixing an amplification signal of said amplifier and said oscillation signal and generating a mixed electrical signal having a difference frequency of said amplification signal and oscillation signal;

a frequency discriminator for comparing said mixed electrical signal with a central frequency and controlling an output voltage according to the comparison result;

a proportional integrator for integrating said output voltage of said frequency discriminator and negatively feeding back a proportional output signal to said temperature-current controller.

2. A beat frequency stabilizing apparatus of pulse light and probe light as claimed in claim 1, wherein said laser source includes a first distributed feedback laser diode for generating pulse light having a first central frequency, and a second distributed feedback laser diode for probe light for generating probe light having a second central frequency.

3. A beat frequency stabilizing apparatus of pulse light and probe light as claimed in claim 2, wherein said second central frequency is higher than said first central frequency by a Brillouin frequency shift.

4. A beat frequency stabilizing apparatus of pulse light and probe light as claimed in claim 2, wherein said temperature-current controller includes a first temperature-current controller for controlling driving current and temperature of said first distributed feedback laser and a second temperature-current controller for controlling driving current and temperature of said second distributed feedback laser diode.

5. A beat frequency stabilizing apparatus of pulse light and probe light as claimed in claim 1, wherein said predetermined frequency of said local oscillator is higher than a frequency of said electrical signal output by said photodetector by around 1 GHz.

6. A beat frequency stabilizing apparatus of pulse light and probe light as claimed in claim 2, wherein said PM coupler generates a mixed light signal has a frequency given by a difference between frequencies of said pulse light and probe light.

7. A beat frequency stabilizing apparatus of pulse light and probe light as claimed in claim 4, wherein the proportional output signal of said proportional integrator is negatively fed back to said second temperature-current controller.

* * * * *